United States Patent [19]

Purdes

[11] Patent Number: 4,878,989
[45] Date of Patent: Nov. 7, 1989

[54] CHEMICAL BEAM EPITAXY SYSTEM

[75] Inventor: Andrew J. Purdes, Garland, Tex.

[73] Assignee: Texas Instruments Incorporated, Dallas, Tex.

[21] Appl. No.: 935,481

[22] Filed: Nov. 26, 1986

[51] Int. Cl.$^4$ ............................................. C23C 16/00
[52] U.S. Cl. ....................................... 156/613; 156/610; 156/DIG. 70; 156/DIG. 103; 118/723; 118/724; 118/725
[58] Field of Search ............... 118/715, 723, 724, 725; 156/610, DIG. 3, 611, 613

[56] References Cited

U.S. PATENT DOCUMENTS

| 3,801,366 | 4/1974 | Lemelson | 427/43.1 |
| 4,051,382 | 9/1977 | Ogawa | 250/531 |
| 4,239,584 | 12/1980 | Chang et al. | 156/DIG. 103 |
| 4,522,674 | 6/1985 | Ninomiya | 118/724 |
| 4,636,268 | 1/1987 | Tsang | 156/611 |

FOREIGN PATENT DOCUMENTS 142840  8/1984  Japan ..................... 118/715
42816   3/1985  Japan ..................... 156/610

OTHER PUBLICATIONS

Tsang, W. T., "Chemical Beam Epitaxy of InP and GaAs," Appl. Phys. Lett., vol. 45, No. 11 (Dec. 1, 1984) pp. 1234–1236.
Brodsky et al., IBM Tech. Dis. Bull., vol. 22, No. 8A, Jan. 1980.
Parker, The Technology and Physics of Molecular Beam Epitaxy, ©1985, Plenum Press, N.Y., p. 31.

Primary Examiner—Richard Bueker
Attorney, Agent, or Firm—Carlton H. Hoel; James T. Comfort; Melvin Sharp

[57] ABSTRACT

Preferred embodiments include a chemical beam epitaxy system (30) with cells for Group III compounds (44) and Group V compounds (40) for epitaxial growth of III–V semiconductor materials on a substrate (38) together with an atomic hydrogen cell (42) for scavenging carbonaceous residues during the chemical beam epitaxy growth to prevent incoporation of carbon impurities in the growing epilayer.

12 Claims, 4 Drawing Sheets

CHEMICAL BEAM EPITAXY SYSTEM

BACKGROUND OF THE INVENTION

1. Field of the Invention.

The present invention relates to crystal growth, and, more particularly, to epitaxially growth of semiconductors.

2. Description of the Related Art.

Epitaxial growth of electronic grade semiconductors such as gallium arsenide (GaAs) relies on methods such as liquid phase epitaxy (LPE), molecular beam epitaxy (MBE), and metalorganic chemical vapor deposition (MOCVD). MBE and MOCVD both provide the ability to grow extremely abrupt p-n junctions and heterojunctions of lattice-matched materials; but the best performance low noise and power monolithic high frequency (60 GHz) radar modules are fabricated from GaAs and $Al_xGa_{1-x}As$ by MBE. However, MBE has serious shortcomings, including the relatively small effusion cell capacity. Typically, less than one hundred epilayers can be prepared between recharges of the cells, and frequent recalibration of the sources are required to compensate for depletion of the cell charges. Recently chemical beam epitaxy (CBE) has been proposed as a system to overcome these shortcomings by combining features of MBE and MOCVD; see, W. Tsang, Chemical Beam Epitaxy of InP and GaAs, 45 Appl. Phys. Lett. 1234 (1984).

The CBE system of Tsang (FIG. 1 is a schematic illustration) has the basic hardware structure of an MBE system: a hemispheral vacuum chamber with sources arranged on the curved surface and aimed at the substrate holder located at the chamber center. The sources in MBE systems are effusion cells containing solid or molten elements (for example, growth of layers of $Al_xGa_{1-x}As$ with various x values and with silicon for n doping requires a cell for each of aluminum, gallium, arsenic, and silicon). The CBE system replaces some or all of the conventional elemental effusion cells with cells that are outlets of tanks of metalorganic gasses (for example, trimethylaluminum (TMAl), triethylgallium (TEGa), and trimethylarsine (TMAs)). This substitution solves the MBE problems of effusion cell life and flux drift, and the CBE cells are much simpler than the MBE effusion cells; but the problem of incorporation of carbon from the gasses in the epilayers arises. See E. Tokumitsu et al, Molecular Beam Epitaxial Growth of GaAs Using Trimethylgallium as a Ga Source, 55 J. Appl. Phys 3163 (1984). This carbon incorporation results in GaAs buffer layers whose carrier density is unacceptably high (in the order of $1 \times 10^{16}$ carriers/cm$^3$) for use with high frequency radar modules; carrier density of at most $1 \times 10^{14}$/cm$^{14}$ is required.

Conventional MOCVD has less of a problem of carbon incorporation because of the presence of atomic hydrogen at the growing epilayer surface; the atomic hydrogen is generated by the decomposition of arsine. This atomic hydrogen reacts with methyl radicals to form relatively inert methane molecules. Under the line of sight conditions of CBE, however, thermal decomposition of arsine at the epilayer surface is unfavored. Precracking of arsine has been used to overcome this problem, but the species impinging on the epilayer are arsenic and molecular hydrogen, not atomic hydrogen. Thus carbon incorporation is a problem even with the arsine precracking approach; see W. Tsang, Chemical Beam Epitaxy of InGaAs, 58 J. Appl. Phys. 1415 (1985).

One approach is to provide a hydrogen ambient (about $3 \times 10^{-4} 3 \times 10^{-4}$ Torr) for MBE or CBE growth and add a hot filament adjacent the growth surface to dissociate the ambient hydrogen into atomic hydrogen; see R. Bachrach et al, On the Possibility of MBE Growth Interface Modification by Hydrogen, 1 J. Vac. Sci. Tech. B 142 (1983). But this approach is not suited to growth on large diameter substrates.

Carbon incorporation in the growing epilayers is a continuing problem in the known CBE systems.

SUMMARY OF THE INVENTION

The present invention provides a chemical beam epitaxy (CBE) system with an atomic hydrogen cell in addition to metalorganic cells and other cells; the atomic hydrogen cell provides a beam of hydrogen atoms which impinge on the growth surface of a substrate concurrently with the beam of metalorganic molecules and other species. The atomic hydrogen reacts with methyl, ethyl, and other carbonaceous radicals to yield relatively inert species such as methane molecules, ethane molecules, and other stable hydrocarbon-like molecules.

This solves the problems of the known MBE and CBE systems by providing continuous beams of metalorganic molecules plus hydrogen atoms to react with the organic radicals released by decomposition of the metalorganic molecules on the growth surface.

BRIEF DESCRIPTION OF THE DRAWINGS

The drawings are schematic for clarity.

DESCRIPTION OF THE PREFERRED EMBODIMENTS

Figure 1:
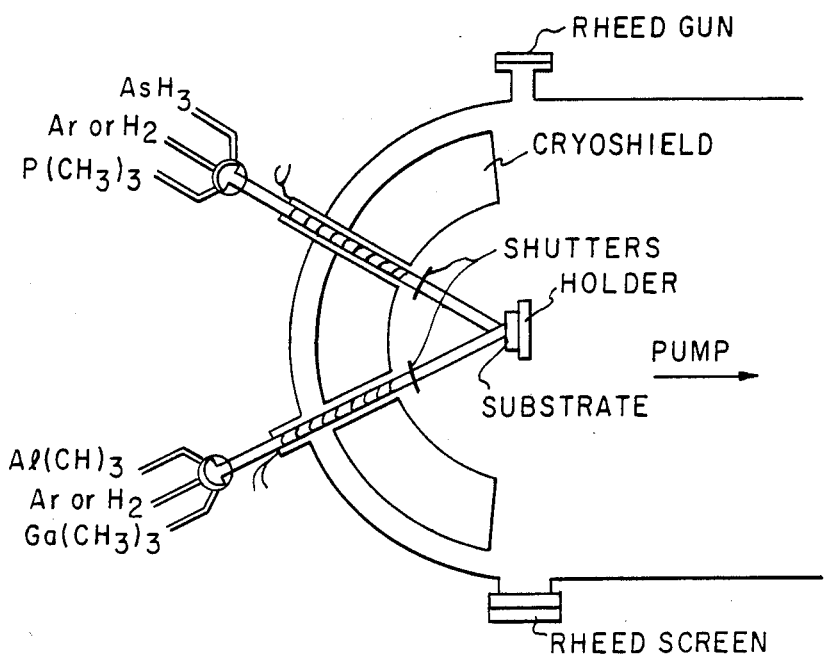
FIG. 1 is a cutaway view of a known CBE system.

A basic, known CBE system is illustrated in schematic cutaway view in FIG. 1 and includes two cells for line of sight molecular beams to impinge on the growth surface of the substrate held in a high vacuum chamber; the upper cell provides the Group V compound together with optional diluent such as argon or molecular hydrogen, and the lower cell provides the Group III compound together with optional diluent. For example, the Group V compound could be trimethylarsenic, arsine, or $As_4$ (evaporated from solid arsenic), the Group III compound could be triethylgallium, and the diluents could be molecular hydrogen or argon. The compound molecules dissociate on the heated (typically 600° C.) substrate surface to release Group III (and Group V) atoms and organic radicals; optionally, the Group V compounds may be cracked to release the Group V atoms while still in the upper cell. The cracking would be thermal at about 800° to 1000° C. The Group III and V atoms migrate on the growing surface of the substrate to epitaxially deposit at appropriate lattice sites; the released radicals evaporate and combine with others or released hydrogen and are pumped away. The pressure in the chamber is about $5 \times 10^{-4}$ Torr during growth, and the flow is about 3 sccm/min for the compounds through the cells. The RHEED apparatus provides in situ analysis of the growing epilayer quality. The shutters permit rapid off-on switching of the beams; this allows for single atomic layer growth and sharp heterostructure growth by use two or more cells with differing Group III compounds. Similarly, doping of the growing epilayer may be provided by cells emitting beams of dopant compounds; and the shutters then lead to sharp junction formation. The substrate typically is rotated during growth to provide uniformity of the epilayer.

Figure 2:
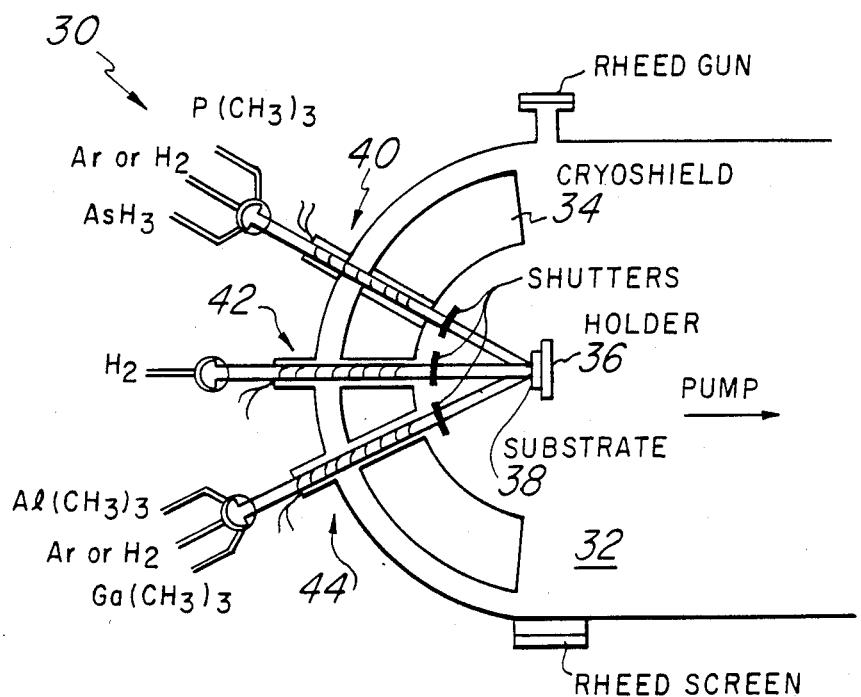
FIG. 2 is a cutaway view of a first preferred embodiment CBE system.

A first preferred embodiment CBE system, generally denoted by reference numeral 30, is schematically shown in cutaway view in FIG. 2 and includes ultra-high vacuum chamber 32 with cryoshield 34, substrate holder 36 holding substrate 38, Group IV compound cell 40, atomic hydrogen cell 42, and Group III compound cell 44. System 30 is analogous to the system of FIG. 1 and is operated in a similar manner, but with the addition of atomic hydrogen cell 42. Cell 42 provides a beam of hydrogen atoms (plus some residual molecular hydrogen) impinging on the growth surface at the precise location of and concurrently with the dissociation of the Group III (and Group V) compounds. Thus the released organic radicals are in an atomic hydrogen ambient and quickly combine to form inert hydrocarbons which are pumped away. This quick combination of the radicals lessens the possibility of the released organic radicals further dissociating to yield elemental carbon which would incorporate into the growing epilayer.

Figure 3C:
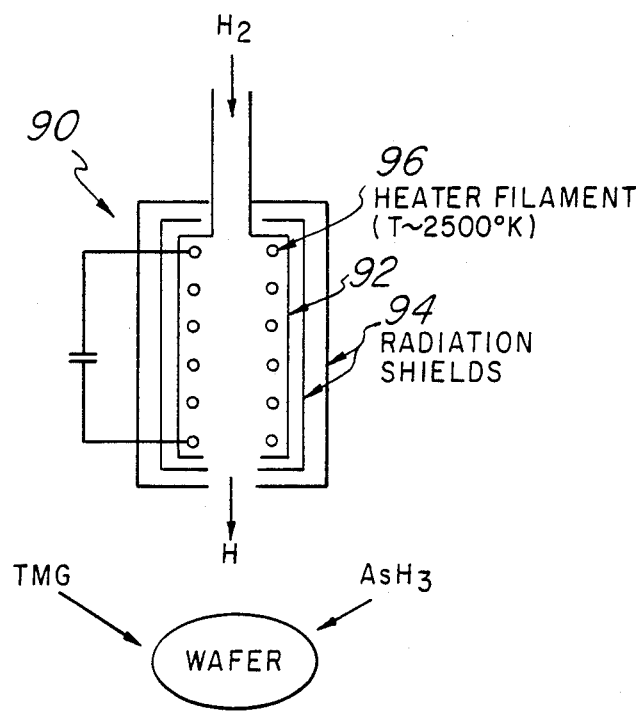
FIGS. 3A-C are detailed views of the atomic hydrogen cells of the preferred embodiments.
Figure 3B:
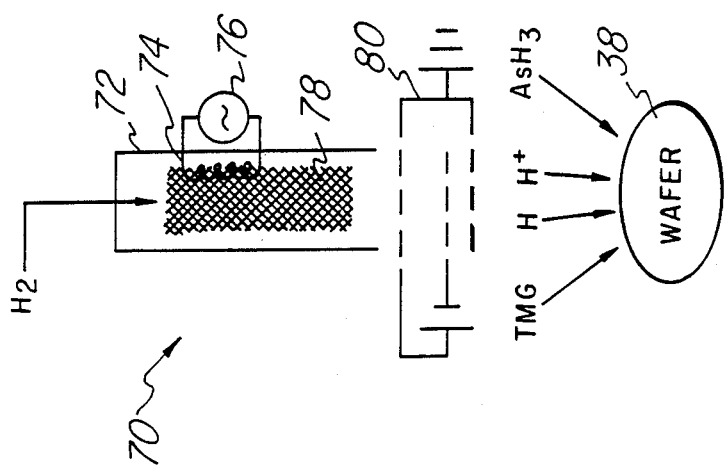
Figure 3A:
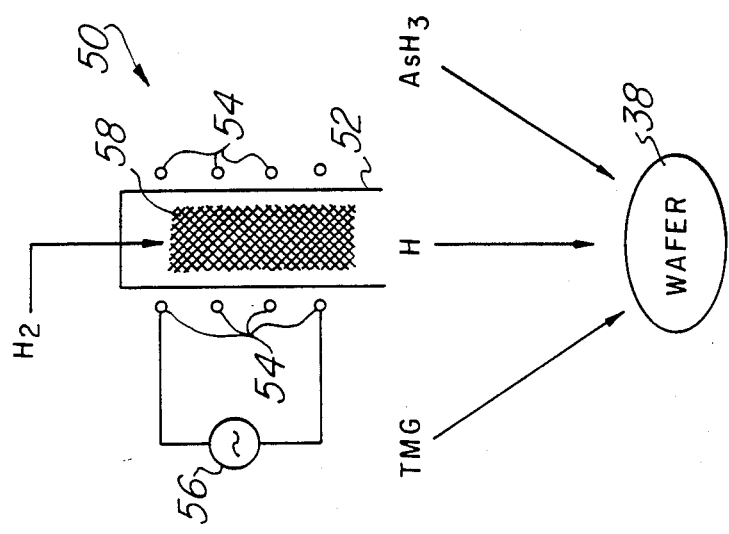

FIGS. 3A–C schematically illustrate in cross sectional view three versions of atomic hydrogen cell 42. In these Figures the concurrent beams of Group III and V compounds (trimethylgallium and AsH₃) and the growing epilayer are also schematically illustrated. Of course, the arsine could be cracked to provide a beam of arsenic atoms and other Group III and V compounds could be used (such as trimethylindium, trimethylphosphorus, phosphine, trimethylantimony, triethylgallium or a combination such as triethylaluminum plus trimethylgallium); the indication of TMG and AsH₃ is only for illustration.

The version of FIG. 3A, generally denoted 50, includes a cylindrical tube 52 which is about 10 mm in diameter, 30 mm long, and made of a refractory metal such as tungsten or molybdenum. The outside of tube 52 is wrapped with a coil of conductor 54 which is driven by rf (13.56 MHz) generator 56. Molecular hydrogen in introduced at the top end (in FIG. 3A) of tube 52 at a pressure of about 1 Torr and a flow of about 5 sccm/min; the flowing hydrogen is excited into a plasma 58 by the rf field, and the ions and electrons recombine to form atomic hydrogen as they exit the rf field and emerge from tube 52 primarily as hydrogen atoms. The combination rate of hydrogen atoms into hydrogen molecules is low due to the very low pressures in tube 52 and vacuum chamber 32. Indeed, there is very little scattering in the beam because the mean free path at growth pressures is several meters; whereas, the distance from cell 42 to substrate 38 is about 25 cm. Generator 56 must supply about 50 watts for these flows and pressures to insure at least 95% of the exiting hydrogen is atomic and not molecular.

FIG. 3B illustrates the second version of cell 42, generally denoted 70, including tube 72 which is 30 mm in diameter, 50 mm long, and made of a refractory metal. Coil 74, made of tungsten, is located within tube 72 and connects through the walls of tube 72 to and is driven by rf generator 76. Molecular hydrogen in introduced at the top end (in FIG. 3B) of tube 72 at a pressure of about 1 Torr and a flow of about 5 sccm/min; the flowing hydrogen is excited into a plasma 78 by the rf field, and the hydrogen ions are accelerated by low voltage (100 V) gun 80 as they exit the rf field and emerge from tube 72. Some of the ions and electrons recombine to form atomic hydrogen, and the beam impinging on the growth surface is roughly 1% ions and 50% hydrogen atoms with a residual of hydrogen molecules.

Figure 4:
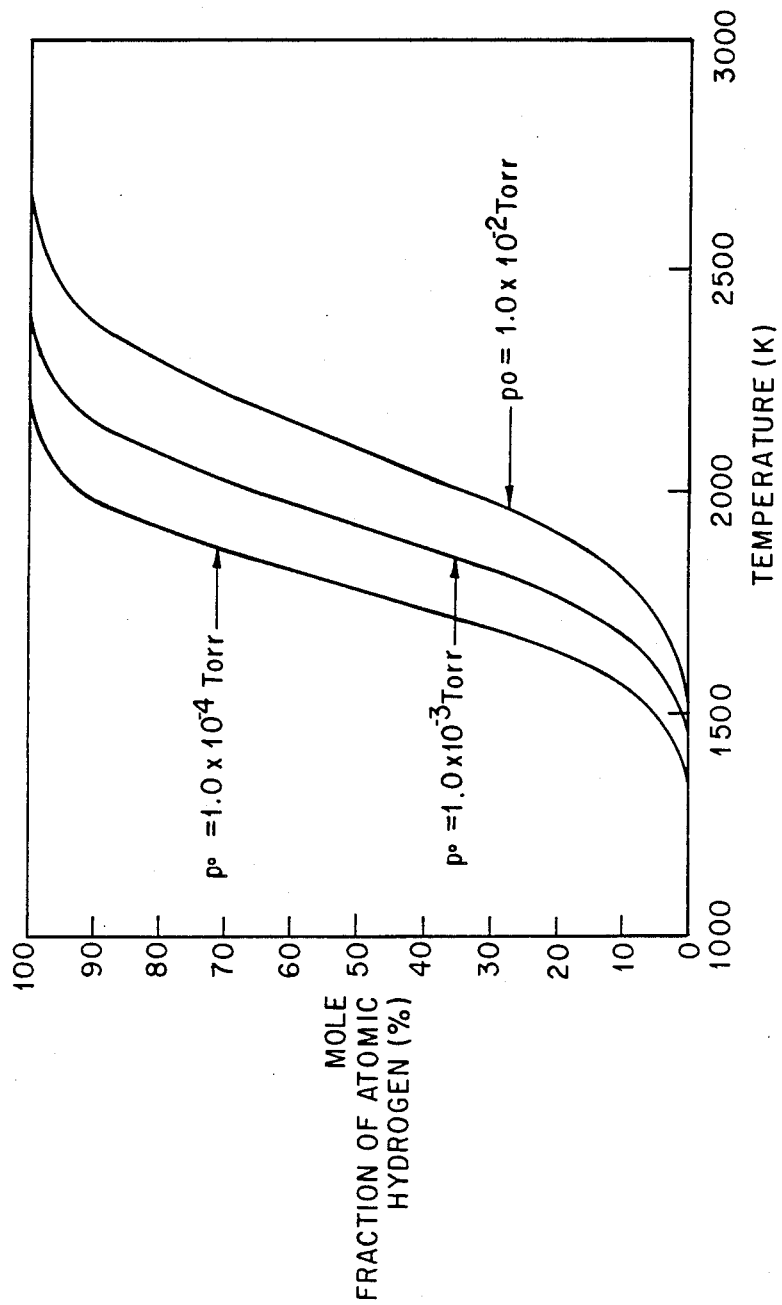
FIG. 4 is a graph of the dissociation of hydrogen molecules into hydrogen atoms as a function of temperature and pressure.

FIG. 3C schematically shows the third version of cell 42, generally denoted 90, including tube 92, radiation shields 94, and cylindrical heater filament 96 which is made of refractory metal and heated by an electric current. As with the other two versions of cell 42, molecular hydrogen is introduced at the top (in FIG. 3C) end of tube 92 and is thermally dissociated into hydrogen atoms by filament 96. Filament 96 is heated to about 2500° K., and radiation shields 94 minimize the heat loading on chamber 32. FIG. 4 shows the dissociation of molecular hydrogen into atomic hydrogen as a function of temperature at various pressures; clearly, many temperatures are feasible for the cracking of molecular hydrogen. The dissociated hydrogen exits the bottom of tube 92 as a beam that impinges on the growth surface along with the Group III and V compounds.

MODIFICATIONS AND ADVANTAGES

Various modifications of the preferred embodiment CBE systems and growth method may be made while retaining the feature of an atomic hydrogen beam impinging concurrently with the beams of Group III and V compounds to provide a scavenging of carbonaceous material released by the dissociations of the Group III or V compounds. In particular, variations in the dimensions and shapes of the cells, the number of cells, the compounds beamed by the cells, the substrate materials, the plasma excitation methods, the dimensions and shape of the vacuum chamber, the pressures and flow rates of the compounds and in the vacuum chamber, and the temperatures and cracking in the cells may all be made with retention of the feature of an atomic hydrogen beam.

For example, the third version 90 of cell 42 could use dc current and a thin walled tube with the current passing axially along the tube; this would eliminate the filament but would be a relatively fragile apparatus. Similarly, growth of strained layers or lattice mismatched materials such as GaAs on silicon may be performed; the substrate on which the epilayers are grown could be various materials such as silicon on insulator, GaAs on silicon, and doped or undoped; and growth of Group II and VI, Group IV and VI, and Group IV materials from compounds including carbon may be handled in a similar manner. Indeed, other growth methods which do not use carbonaceous compounds may still benefit from a concurrent atomic hydrogen beam.

The advantages of the preferred embodiment CBE systems and growth method include the low carbon incorporation epilayer growth which is simple and applicable to large diameter substrates.

What is claimed is:
1. A chemical beam epitaxy system, comprising:
(a) a vacuum chamber;
(b) a substrate holder within said chamber;

(c) a plurality of cells in said chamber, each of said cells providing a beam directed at a substrate in said substrate holder, each of said beams essentially consisting of atoms or molecules selected from the group consisting of atomic hydrogen, compounds of elements which are constituents of material to be epitaxially grown on said substrate, elements which are constituents of material to be epitaxially grown on said substrate, and diluents, with at least one of said cells with a beam including atomic hydrogen.

2. The system of 1, wherein:
(a) said at least one of said cells including a thermal cracker for cracking molecular hydrogen to atomic hydrogen.

3. The system of 1, wherein:
(a) said at least one of said cells including a rf generator for exciting molecular hydrogen into a plasma.

4. A chemical beam epitaxy system, comprising:
(a) a vacuum chamber;
(b) a substrate holder within said chamber; and
(c) a plurality of cells in said chamber, each of said cells oriented to provide a beam directed at a substrate held by said substrate holder, and at least one of said cells providing a beam including atomic hydrogen.

5. The system of 4, wherein:
(a) said at least one of said cells including a thermal cracker for cracking molecular hydrogen to atomic hydrogen.

6. The system of 4, wherein:
(a) said at least one of said cells including a rf generator for exciting molecular hydrogen into a plasma.

7. A method of epitaxial growth of compound materials on a substrate, comprising the steps of:
(a) directing a first beam including a first compound of a first element at a surface of a substrate in an evacuated chamber, said first compound containing carbon;
(b) directing a second beam including a second compound of a second element at said surface in said chamber concurrently with said first beam, said first and second elements constituents of a compound material; and
(c) directing a third beam including atomic hydrogen at said surface in said chamber concurrently with said first and second beams.

8. The method of claim 7, wherein:
(a) said first element is gallium;
(b) said first compound is selected from the group consisting of trimethylgallium, triethylgallium, and mixtures of the two;
(c) said second element is arsenic;
(d) said second compound is selected from the group consisting of arsine, molecular arsenic, atomic arsenic, trimethylarsenic, triethylarsenic, and mixtures of two or more; and
(e) said first and second beams include diluents.

9. The method of claim 7, further comprising the step of:
(a) directing a fourth beam including a fourth compound of a fourth element at said surface in said chamber concurrently with said first, second and third beams, said fourth element a constituent of said compound material.

10. The method of claim 7, wherein:
(a) said first element is gallium;
(b) said first compound is selected from the group consisting of trimethylgallium, triethylgallium, and mixtures of the two;
(c) said second element is arsenic;
(d) said second compound is selected from the group consisting of arsine, molecular arsenic, atomic arsenic, trimethylarsenic, triethylarsenic, and mixtures of two or more;
(e) said fourth element is aluminum;
(f) said fourth compound is selected from the group consisting of trimethylaluminum, triethylaluminum, and mixtures of the two; and
(g) said first, second, and fourth beams include diluents.

11. The method of claim 7, further comprising the step of:
(a) directing a fifth beam including a fifth compound of a fifth element at said surface in said chamber concurrently with said first, second, and third beams, said fifth element a dopant for said compound material.

12. The method of claim 7, further comprising the step of:
(a) directing a fifth beam including a fifth compound of a fifth element at said surface in said chamber concurrently with said first, second, and third beams, said fifth element a dopant for said compound material.

* * * * *